United States Patent [19]

Terui

[11] 4,446,493
[45] May 1, 1984

[54] VARIABLE FREQUENCY-RESPONSE EQUALIZER

[75] Inventor: Nobuo Terui, Tokyo, Japan

[73] Assignee: Olympus Optical Co., Ltd., Tokyo, Japan

[21] Appl. No.: 320,482

[22] Filed: Nov. 12, 1981

[30] Foreign Application Priority Data

Nov. 26, 1980 [JP] Japan .............................. 55-169361

[51] Int. Cl.³ .............................................. G11B 5/45
[52] U.S. Cl. ........................................ 360/65; 360/67
[58] Field of Search ................................... 360/65, 67

[56] References Cited

U.S. PATENT DOCUMENTS 3,631,365 10/1971 Dolby .
4,038,692 7/1977 Umeda et al. ......................... 360/65
4,263,624 4/1981 Gundry ................................ 360/65
4,297,730 10/1981 Kadowaki et al. ................... 360/65

Primary Examiner—Vincent P. Canney
Attorney, Agent, or Firm—Frishauf, Holtz, Goodman & Woodward

[57] ABSTRACT

Disclosed is a variable frequency-response equalizer which includes an amplifying circuit having a predetermined equalizing frequency characteristic, a time constant changing circuit for changing a time constant regarding the high frequency response of a playback output signal produced from the amplifying circuit, and a level sensor for determining a change of the time constant caused by the time constant changing circuit according to the level of the signal amplified by the amplifying circuit. The magnitude of the time constant is reduced when the level of the signal amplified becomes lower than a predetermined value.

6 Claims, 7 Drawing Figures

VARIABLE FREQUENCY-RESPONSE EQUALIZER

BACKGROUND OF THE INVENTION

This invention relates to an equalizer with a variable equalizing time constant which is changed according to the input signal level, and more particularly, to a playback equalizer for a tape recorder having a variable equalizing time constant wherein the higher frequency response is emphasized with reduction of the recording level.

Recent home use cassette decks mostly include a built-in noise reduction system. For such noise reduction system, a B-type Dolby system having an encoding characteristics as shown in FIG. 1 has been extensively used. This system is extremely effective for reducing the tape hiss noise, and Dolby encoding is widely adopted in the cassette tape recording. Most cassette tapes adopt Dolby encoding whether they are recorded by the user or commercially available music cassette tapes. For obtaining proper playback of such Dolby encoded recording tape, a correctly adjusted regular Dolby decoder is necessary. The circuitry of such a decoder is disclosed in, for instance, FIG. 4 of U.S. Pat. No. 3,631,365 (Dec. 28, 1971, Ray M. Dolby). However, the regular Dolby decoder is complicated in circuit construction and increases in no small quantities the cost of manufacture. Even if an exclusive IC including a Dolby decoder is used, many peripheral circuit component parts involved constitute a problem when it is intended to reduce the size of the product.

This problem becomes more serious where a noise reduction system such as the Dolby system is incorporated in a microcassette. The tape running speed of the microcassette (typically being 2.4 or 1.2 cm/sec) is slow compared to the Philips type cassette. Therefore, incorporation of a noise reduction system is desired from the standpoint of improving the signal-to-noise (S/N) ratio. However, for a microcassette tape recorder, particularly for a playback only type portable microcassette tape recorder, small size, light weight and low price are desired. Therefore, it is often infeasible to assemble a regular noise reduction decoder such as the B-type Dolby decoder in a microcassette tape player. For playing back a Dolby encoded tape without use of any regular decoder, a high frequency cutting by a tone control circuit has been known as a convenient method. With this method, however, when a high level signal (usually above −10 to −20 VU in level in the case of FIG. 1) with a small preemphasis is reproduced at the time of playback, too much attenuation over the high frequency range results, thus considerably deteriorating the quality of the reproduced sound.

SUMMARY OF THE INVENTION

This invention has been developed in the light of the above affairs, and its object is to provide a variable frequency-response equalizer, which permits appropriate noise reduction decoding with a simple construction.

To attain this object, in an equalizer according to the present invention the playback time constant (for high frequency region) is changed according to the playback output signal level. In the tape recorder or tape player, a playback equalizer is indispensable for frequency-compensating and amplifying a higher frequency emphasized signal detected by the playback head to provide a flat signal. Therefore, the playback equalizer is provided regardless of whether a noise reduction system such as the B-type Dolby system is incorporated or not. The inventor has pondered upon providing a system, which serves both as a playback equalizer and a Dolby decoder, without using any particular decoder but by permitting the time constant of the playback equalizer to be varied according to the playback output signal level. Trial experiments have been conducted, and the results have confirmed that a playback equalizer having a function of the Dolby decoder is obtainable by adding a certain circuit to the equalizer.

DETAILED DESCRIPTION OF THE PREFERRED EMBODIMENTS

Before proceeding with the description of the embodiment of the invention, it will expressly be understood that like reference symbols are used to designate like portions throughout the drawings for simplicity of illustration and that the components designated by like reference symbols may easily be replaced with each other or one another with minor change thereof by a skilled person in the art.

Figure 2:
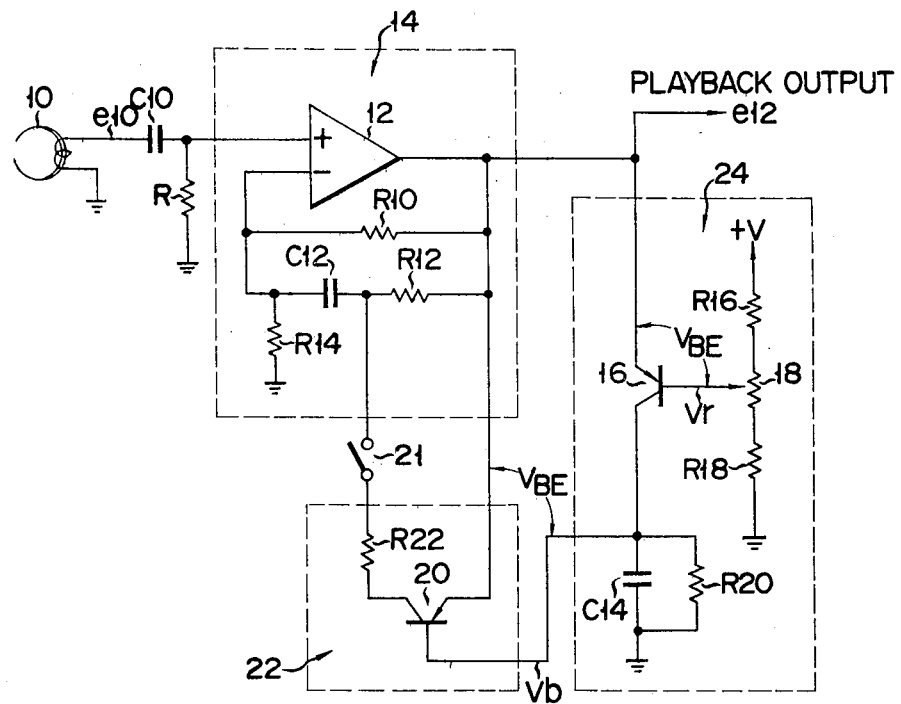
FIG. 2 is a circuit diagram showing a variable time constant type equalizer embodying the invention.

FIG. 2 shows an embodiment of the variable frequency-response equalizer. A playback head 10 is mounted in a tape transport (not shown). A low level signal e10 output from the playback head 10 is coupled through a capacitor C10 to the noninverted input terminal of an amplifier 12. The noninverted terminal is grounded through an input resistor R. The output terminal of the amplifier 12 is connected through a resistor R10 to the inverted input terminal thereof. The inverted input terminal is connected through a capacitor C12 and a resistor R12 to the output terminal of the amplifier 12. The inverted input terminal is also grounded through a resistor R14. The circuit elements 12, C12 and R10 to R14 constitute an amplifier circuit 14 having a predetermined frequency-response characteristic. A low frequency range time constant TL corresponds to C12×R10 and a high frequency range time constant TH1 to C12×R12. With a microcassette system, the nominal value of the time constant TH1 is 200 μsec (normal tape) or 120 μsec (metal tape) for the tape running speed of 2.4 cm/sec.

A playback output signal produced from the amplifier 12 is coupled to the emitter of a pnp transistor 16. The base of the transistor 16 is connected to the slider of a variable resistor 18. A positive potential +V is applied through a resistor R16 to one end of the variable resistor 18, and the other end thereof is grounded through a resistor R18. The collector of the transistor 16 is grounded through a parallel circuit consisting of a capacitor C14 and a resistor R20. The parallel circuit may be connected to a circuit with a suitable potential, e.g., the potential +V circuit, not to the circuit ground. The collector of transistor 16 is connected to the base of a pnp transistor 20. The transistor 20 has its emitter connected to the output terminal of the amplifier 12 and its collector connected through a resistor R22 and a switch 21 to the junction between the capacitor C12 and resistor R12. When a reproduced output signal e12 derived from the circuit 14 becomes lower than a predetermined potential $Vr+V_{BE}$, the transistor 16 is cut off to reduce the base potential Vb on the transistor 20. As a result, the transistor 20 is conducted. Vr is the slider potential on the variable resistor 18, and $V_{BE}$ is the base-emitter threshold voltage of the transistor 16. When the transistor 20 is conducted with the closure of the switch 21, the high frequency time constant of the circuit 14 is reduced from $TH1=C12 \times R12$ to $TH2=C12 \times (R12//R22)$, where "//" means a parallel connection.

The elements 20 and R22 form a time constant change circuit 22 for changing time constant TH which relates to the higher frequency response of the reproduced output signal e12 produced from the amplifier circuit 14. The elements 16, 18, C14 and R16 to R20 constitute a level sensor 24 for determining the time constant change (TH1⇌TH2) established by the time constant change circuit 22 according to the level of signal (such as signal e10 or e12) amplified by the circuit 14.

It is possible to replace the capacitor C12 with the resistor R12, the resistor R12 with the capacitor C12 and the resistor R22 with a capacitor C22 (not shown), provided that an inverter (not shown) is deposited in the base circuit of the transistor 20. In this case, when the transistor 20 is conducted, the high frequency playback time constant is changed from a small time constant provided by the elements C12 and R12 to a large time constant provided by the elements C12+C22 and R12.

Now, the case where the switch 21 is "on" is considered. It is also assumed that the variable resistor 18 is adjusted such that the predetermined voltage $Vr+V_{BE}$ for determining if the transistor 16 is "on" or not corresponds to a signal level of −20 VU of the reproduced output signal e12. When the level of the signal e12 exceeds −20 VU, the transistor 16 is conducted, whereupon the emitter-base voltage of the transistor 20 becomes the collector-emitter saturation voltage $V_{CE(SAT)}$ of the transistor 16. Since the voltage $V_{BE}$ of the transistor 20 is higher than the aforementioned voltage $V_{CE(SAT)}$, with the conduction of the transistor 16, the transistor 20 is cut off. With a silicon transistor for low level amplifying, $V_{BE} \approx 0.6$ V and $V_{CE(SAT)} \leq 0.1$ V at room temperature. Thus, when the level of the signal e12 is sufficiently higher than $Vr+V_{BE}$, there holds $TH1=C12 \times R12$.

The time constant of a CR filter constituted by the capacitor C14 and resistor R20 is empirically set to a value, at which smooth on/off operation of the transistor 20 can be obtained. Usually, $C14 \times R20$ is preferably set to a few seconds. Since the charging of the capacitor C14 is done through the "on" state resistance of the transistor 16 which is low, the time constant of charging of the capacitor C14 is considerably small.

With the circuitry of FIG. 2, it is possible to shorten the rise time of the potential Vb and extend the fall time thereof at the same time.

Figure 3:
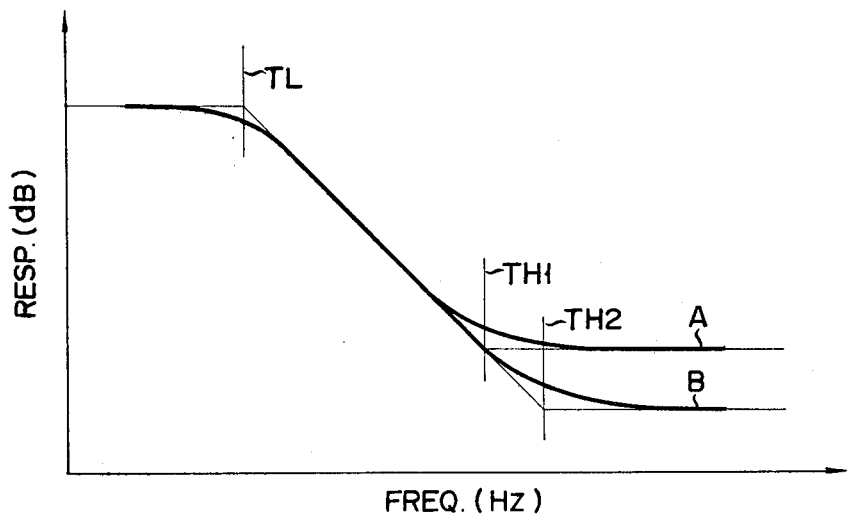
FIG. 3 is a graph useful for explaining the operation of the circuit of FIG. 2.

Curve A in FIG. 3 shows the frequency characteristic of the amplifier circuit 14 when the high frequency time constant is TH1. When the level of the signal e12 becomes lower than the aforementioned signal level of −20 VU, the transistor 16 is cut off to reduce the base potential Vb. When the potential difference (e12−Vb) exceeds the voltage $V_{BE}$ of the transistor 20, the transistor 20 is rendered conductive. Thus, when the level of the signal e12 is reduced to be sufficiently lower than the level $Vr+V_{BE}$, the high frequency time constant is reduced from TH1 to $TH2=C12 \times (R12//R22)$ (where the double slash symbol "//" means the parallel connection of resistors). Curve B in FIG. 3 shows the frequency characteristic of the amplifier circuit 14 when the high frequency time constant is TH2. When the level of the signal e12 is in the neighborhood of $Vr+V_{BE}$, the frequency characteristic of the circuit 14 possesses an intermediate characteristic between the curves A and B in FIG. 3. The response level difference between the curves A and B depends on what level of the signal e12 corresponds to the aforementioned predetermined level $Vr+V_{BE}$. Where B-type Dolby system is adopted as the noise reduction system and $Vr+V_{BE}$ corresponds to −10 VU to −20 VU, the maximum level difference between the curves A and B roughly ranges from 5 to 10 dB.

Figure 1:
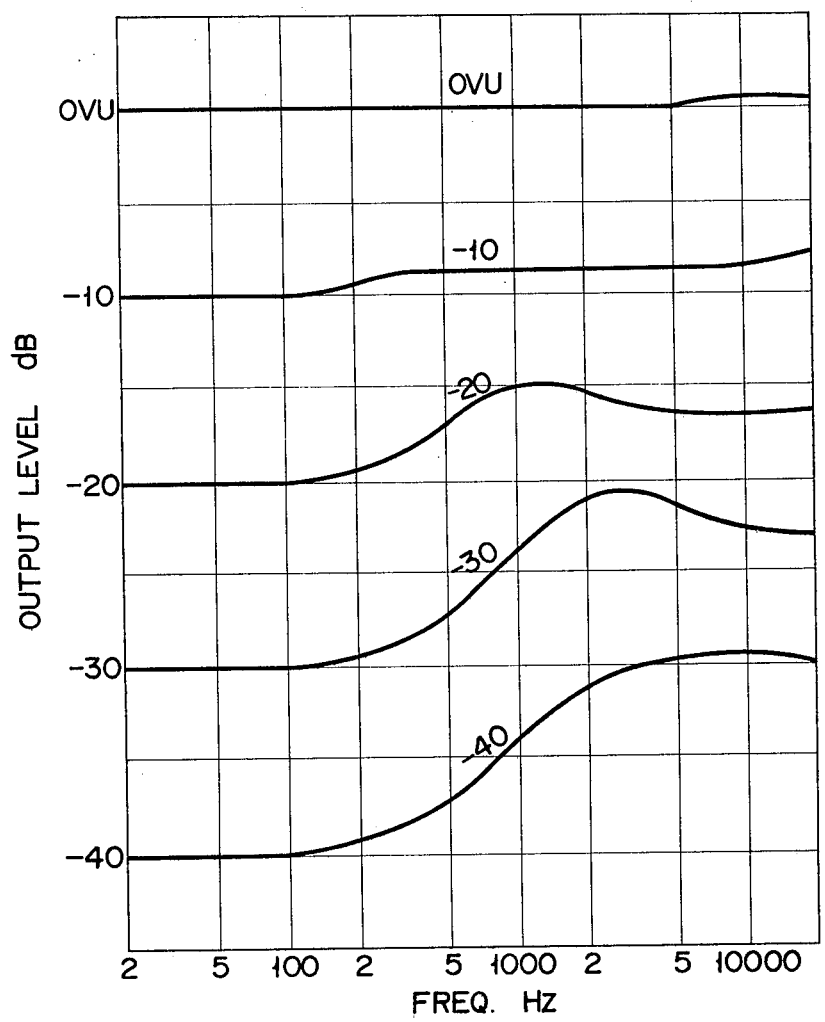
FIG. 1 is a graph showing the encoding characteristics of a noise reduction system (B-type Dolby system)
Figure 4:
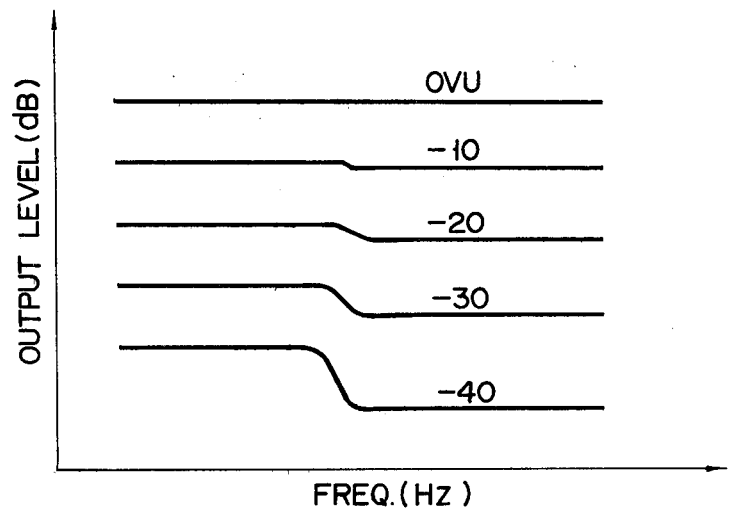
FIG. 4 is a graph showing the decoding characteristics of the circuit of FIG. 2.
Figure 6:
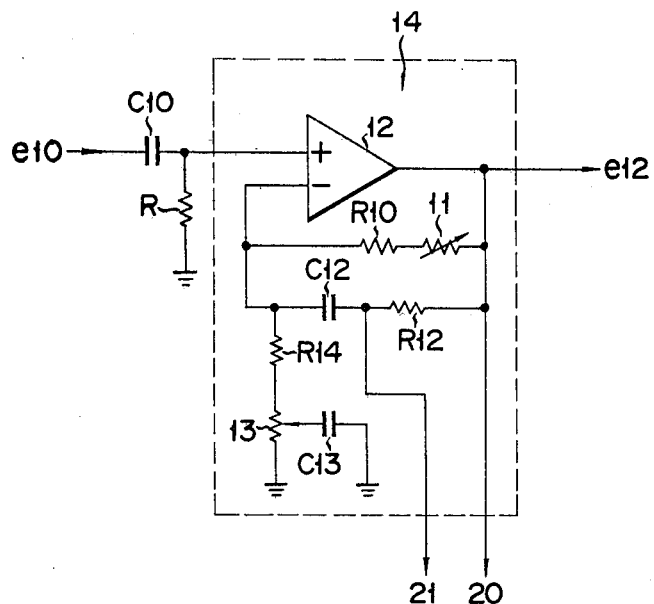
FIG. 6 is a circuit diagram showing a tone control circuit cooperatively used with the equalizer 14 shown in FIG. 2.
Figure 7:
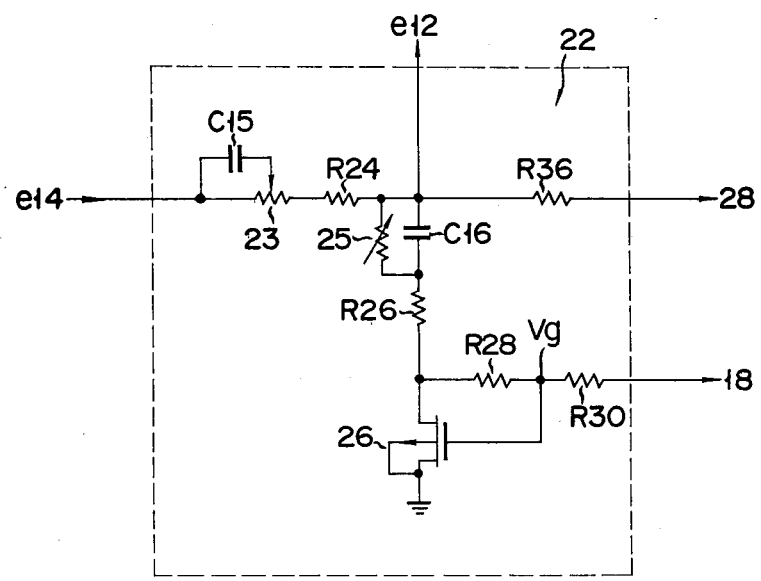
FIG. 7 is a circuit diagram showing a tone control circuit cooperatively used with the time constant changing circuit shown in FIG. 5.

FIG. 4 shows the decoding characteristics of the circuit shown in FIG. 2. When a tape encoded with the characteristics shown in FIG. 1 is decoded with the characteristics shown in FIG. 4, slight wavings may be produced in the higher frequency range and in a small level range less than −20 VU. Such frequency response wavings, however, can be suppressed or minimized to an extent giving no unnatural sound in hearing. When the switch 21 is turned off, the high frequency time constant of the amplifier circuit 14 becomes constant at TH1 irrespective of the level of the signal e12. In other words, approximate B-type Dolby decoding is obtained only when the switch 21 is "on". It is to be further noted that by using the circuit of FIG. 2 in combination with a high and/or low frequency response control circuit as shown in FIG. 6 or 7, the Dolby encoded tape will be more naturally played back.

Figure 5:
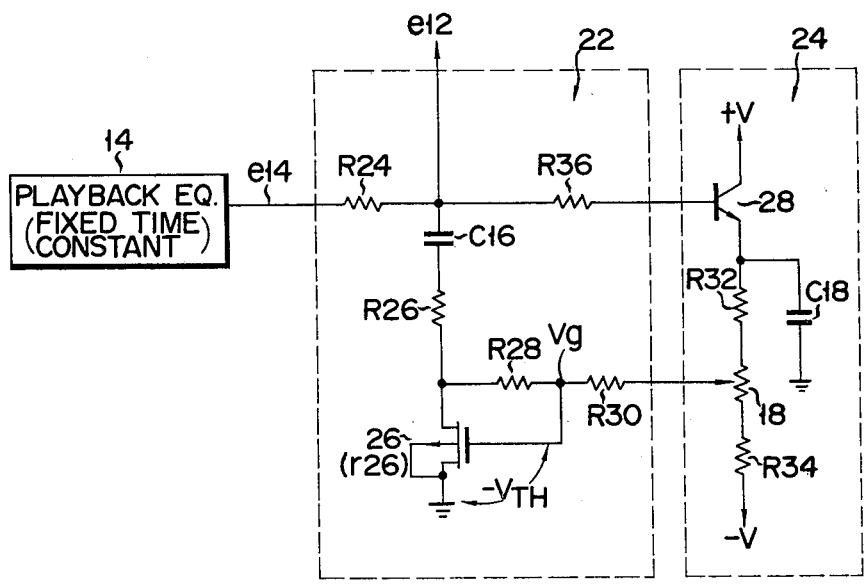
FIG. 5 is a circuit diagram showing another embodiment of the invention.

FIG. 5 shows another embodiment of the invention. While in the embodiment of FIG. 2 the resistance of the NFB branch in the NF-type equalizer is changed according to the signal level, in the circuit of FIG. 5 an output signal e14 of a fixed time constant type playback equalizer 14 is converted into the playback output signal e12 through a CR filter. More particularly, the signal e14 is coupled through a resistor R24, a capacitor C16 and a resistor R26 to the drain of a p-channel MOS FET 26. The FET 26 has its source grounded and its gate connected through a resistor R28 to its drain. The gate of the FET 26 is also connected through a resistor R30 to the slider of a variable resistor 18. The variable resistor 18 is connected at one end through a resistor R32 to the emitter of an npn transistor 28, and is connected at the other end through a resistor R34 to a negative potential terminal of −V. The transistor 28 has its collector connected to a positive potential terminal +V and its base connected through a resistor R36 to the juncture between the resistor R24 and capacitor C16. The emitter of the transistor 28 is grounded through a capacitor C18. The capacitor C18 is charged by the low impedance emitter output of the transistor 28, and is discharged through the resistors R32, 18 and R34 providing a far higher impedance than that of the emitter impedance. Thus, the emitter potential on the transistor 28 and the slider potential of the variable resistor 18 may have a short rise time and a long fall time.

The elements 26, C16 and R24 to R30 constitute a time constant change circuit 22. The elements 18, 28, C18 and R32 to R34 constitute a level sensor 24.

It is now assumed that the variable resistor 18 is adjusted such that the gate potential Vg on the FET 26 is slightly above the threshold potential $-V_{TH}$ of the FET 26 when the level of the playback output signal e12 is $-20$ VU. Under a condition $Vg > -V_{TH}$, the FET 26 is "off", and the inner resistance (i.e., drain-source resistance) r26 of FET 26 is substantially infinity. If it is assumed that R26<<R28, the frequency response of a CR network including the elements R24, C16 and R26 is flat. When the level of the signal e12 is sufficiently higher than $-20$ VU, $Vg > -V_{TH}$, and the aforementioned flat response is maintained. When the level of the signal e12 becomes less than $-20$ VU, a condition $Vg \leq -V_{TH}$ results. As a result, the FET 26 is conducted. In this state, the internal resistance r26 is no longer ignored. More particularly, at a signal level less than $-20$ VU, the CR network including the elements R24, C16, R26 and r26 has a high frequency cut characteristic. If R26>>r26 when the level of the signal e12 is $-40$ VU, the maximum attenuation degree of the CR network in the higher frequency range is R26/(R24+R26) at the level of $-40$ VU. Thus, the characteristic as shown in FIG. 4 can be obtained even with the circuit construction of FIG. 5.

If the on-off switch 21 for decoding operation is to be provided in the circuit of FIG. 5, one of its suitable location is between the resistor R26 and the drain of the FET 26. The resistors R28 and R30 in the circuit of FIG. 5 from an NFB network with respect to the FET 26. With this NFB network, a non-linearity of the inner resistance r26 can be improved, and also the inner resistance r26 can change smoothly with changes in the level of the signal e12.

Incidentally, it is possible to let the signal e14 be coupled directly to the base of the transistor 28.

FIG. 6 shows a system, in which a low and high frequency tone control circuit is added to the playback equalizer 14 shown in FIG. 2. A variable resistor 11 for low frequency controlling is provided between the output terminal of the amplifier 12 and the resistor R10. With changes in the resistance of the resistor 11, the magnitude of the low frequency time constant TL (C12×R10 plus resistance of 11) of the equalizer 14 is changed. Thus, the frequency response in the low frequency region can be controlled with the resistor 11. A variable resistor 13 for high frequency control is inserted between the resistor R14 and the circuit ground. The slider of the resistor 13 is grounded through a capacitor C13. The NFB amount for the amplifier 12 in the high frequency region can be varied according to the slider position of the variable resistor 13. Thus, the higher frequency response can be adjusted by the resistor 13 and capacitor C13. With the circuit of FIG. 6, not only approximate Dolby decoding but also high and low frequency tone control can be obtained from a few additional circuit parts combined with the prior art equalizer circuit.

FIG. 7 shows a system, in which a low and high frequency tone control circuit is added to the time constant change circuit 22. Here, a variable resistor 23 is provided between the output terminal of the playback equalizer 14 and a resistor R24. A capacitor C15 is connected between the input side terminal of the resistor 23 and the slider thereof. The impedance elements that are present in the path from the point, to which the signal e14 is coupled, to the point, from which the signal e12 appears, are the elements C15, 23 and R24. The total impedance of these elements is varied according to the slider position of the variable resistor 23. Thus, the higher frequency response can be controlled by the resistor 23 and capacitor C15. A variable resistor 25 for lower frequency control is connected in parallel with a capacitor C16. The impedance ($1/j2\pi fC16$) of the capacitor C16 increases in proportion to the increase of frequency. However, the maximum total impedance of the parallel circuit of the capacitor C16 and resistor 25 is varied according to the amount of the resistance of the resistor 25. Thus, the low frequency response can be controlled by the resistor 25. With the circuit of FIG. 7, approximate B-type Dolby decoding as well as high and low frequency tone control can be obtained from the elements 23, 25, 26, C15, C16, R24 and R26.

The embodiments described in the specification and illustrated in the drawings are by no means limitative of the invention, and various additions, changes and modifications are possible without departing from the scope of the invention. For example, it is possible to use a plurality of time constant change circuits 22 and a plurality of level sensors 24, these circuits and sensors having respectively different characteristics.

Also, the transistor 20 shown in FIG. 2 may be replaced with an FET, and the FET 26 shown in FIG. 5 may be replaced with a bipolar transistor. Further, while in the circuits of FIGS. 2 and 5 the rectifying function of the base-emitter path of transistors is utilized to produce DC potentials (Vb and Vg) corresponding to the level of the signal e12, it is possible to use diodes for the signal rectifying.

Further, in FIG. 5 or 7, it is possible to use a flat frequency response amplifier for the playback amplifier 14, and the time constants of the playback equalizer, for instance 1,590 and 120 $\mu$sec, may be provided with the CR elements C16, R24 and R26.

What is claimed is:

1. A variable frequency response playback equalizer, comprising:
    playback amplifier means responsive to an unequalized input signal and having a given time constant regarding a frequency response characteristic thereof, for equalizing said unequalized input signal to produce an equalized playback output signal;
    level sensor means coupled to said playback amplifier means for generating a time constant change signal when the signal level of said equalized output signal exceeds a given level; and
    time constant change means coupled to said playback amplifier means and to said level sensor means for increasing said given time constant when said time constant change signal is generated to cause the signal level of said equalized playback output signal to be increased at high frequency regions.

2. A variable frequency-response equalizer comprising:
    a playback head;

equalizer means coupled to said playback head for amplifying an output signal from said head with a given equalizing frequency characteristic and for providing an equalizer input signal, said equalizer means having an equalizing time constant means for determining said given equalizing frequency characteristic;

level sensor means coupled to said equalizer means and responsive to said equalizer output signal, for generating a time constant change signal when the level of the equalizer output signal exceeds a predetermined level, said level sensor means including:
  a capacitor for storing a voltage potential corresponding to said time constant change signal;
  means coupled to said capacitor for causing discharge thereof; and
  means coupled to said capacitor for providing a charging current corresponding to the magnitude of said equalizer output signal to said capacitor; and time constant change means coupled to said level sensor means and to said equalizer means, for changing said equalizing time constant of said equalizer means as a function of said time constant change signal.

3. An equalizer of claim 2, wherein said time constant change means includes:
  impedance means for changing said equalizing time constant when said impedance means is coupled to said equalizing time constant means; and
  switch means coupled to said equalizing time constant means, to said impedance means and to said level sensor means, for coupling said impedance means to said equalizing time constant means when said time constant change signal is generated.

4. An equalizer of claim 2, which further comprises: tone control means coupled to said equalizer means for manually changing said equalizing time constant.

5. A variable frequency-response equalizer comprising:
  a playback head;
  equalizer means coupled to said playback head for amplifying an output signal from said head with a fixed equalizing frequency characteristic to produce an equalizer output signal;
  filter means coupled to said equalizer means and responsive to said equalizer output signal, for providing a filtered output signal corresponding to said equalizer output signal;
  variable impedance means coupled to said filter means for changing the frequency characteristic of said filter means according to a control signal; and
  control means coupled to said variable impedance means for providing said control signal in response to said equalizer output signal or said filtered output signal, a total frequency characteristic of said control means, said equalizer means and said filter means being effective to determine an equalizing frequency characteristic of the equalizer, part of said equalizing frequency characteristic being changed as a function of said control signal, said control means including:
    a capacitor for storing a voltage potential corresponding to said control signal;
    means coupled to said capacitor for causing discharge thereof; and
    means coupled to said capacitor for providing a charging current corresponding to the magnitude of said equalizer output signal or said filtered output signal to said capacitor.

6. An equalizer of claim 5, which further comprises:
tone control means coupled to said filter means for manually changing the frequency-response of said filter means.

* * * * *